(12) United States Patent
Johnson et al.

(10) Patent No.: US 8,349,099 B1
(45) Date of Patent: Jan. 8, 2013

(54) METHOD OF ALLOYING REACTIVE COMPONENTS

(75) Inventors: Alfred David Johnson, San Leandro, CA (US); Walter A. Bachmann, Pacifica, CA (US)

(73) Assignee: Ormco Corporation, Orange, CA (US)

( * ) Notice: Subject to any disclaimer, the term of this patent is extended or adjusted under 35 U.S.C. 154(b) by 1439 days.

(21) Appl. No.: 11/948,852

(22) Filed: Nov. 30, 2007

Related U.S. Application Data

(60) Provisional application No. 60/868,116, filed on Dec. 1, 2006.

(51) Int. Cl.
*C22C 1/02* (2006.01)

(52) U.S. Cl. ........................ 148/538; 420/590

(58) Field of Classification Search .................. 420/590; 148/538
See application file for complete search history.

(56) References Cited

U.S. PATENT DOCUMENTS

| | | | |
|---|---|---|---|
| 368,425 A | 8/1887 | Ross et al. | |
| 538,593 A | 4/1895 | Naylor, Jr. | |
| 1,560,335 A | 11/1925 | Czochralski | |
| 1,904,828 A | 4/1933 | Green | |
| 1,913,035 A | 6/1933 | Loepsinger | |
| 1,926,925 A | 9/1933 | Wescott | |
| 2,060,593 A | 11/1936 | Schaurte et al. | |
| 2,371,614 A | 3/1945 | Graves | |
| 2,586,556 A | 2/1952 | Mullikin | |
| 2,608,996 A | 9/1952 | Forman | |
| 2,610,300 A | 9/1952 | Walton et al. | |
| 2,647,017 A | 7/1953 | Coulliette | |
| 2,793,036 A | 5/1957 | Hansburg | |
| 2,911,504 A | 11/1959 | Cohn | |

(Continued)

FOREIGN PATENT DOCUMENTS

EP 0053596 6/1982

(Continued)

OTHER PUBLICATIONS

English translation JP 04-099832 A by Fukumoto et al. published Mar. 31, 1992.*

(Continued)

*Primary Examiner* — George Wyszomierski
*Assistant Examiner* — Tima M McGuthry Banks
(74) *Attorney, Agent, or Firm* — Wood, Herron & Evans, LLP

(57) ABSTRACT

Metal seeds for forming single-crystal shape-memory alloys (SMAs) may be fabricated with high reliability and control by alloying thin films of material together. In particular, described herein are methods of forming AlCuNi SMAs by first producing high-quality seeds (ingots) of copper, aluminum, and nickel to produce for pulling single crystal shape memory alloys, in particular superelastic or hyperelastic alloys. The method is applicable to a wide range of alloys in which one or more of the components are reactive. The method is an improvement upon traditional methods such as mixing and melting pellets. In this improved method, a reactive layer (e.g., aluminum) is provided in thin flat layers between layers of other materials (e.g., copper and layers of nickel). When the stacked layers are vacuum heated in a crucible to the melting temperature of the reactive layer, it becomes reactive and chemically bonds to the other layers, and may form eutectics that, as the temperature is further increased, melt homogeneously and congruently at temperatures below the melting temperatures of copper and nickel. Oxidation and evaporation are greatly reduced compared to other methods of alloying, and loss of material from turbulence is minimized.

21 Claims, 3 Drawing Sheets

U.S. PATENT DOCUMENTS

| | | |
|---|---|---|
| 3,229,956 A | 1/1966 | White |
| 3,351,463 A | 11/1967 | Rozner et al. |
| 3,357,432 A | 12/1967 | Sparks |
| 3,400,906 A | 9/1968 | Stocklin |
| 3,408,890 A | 11/1968 | Bochman, Jr. |
| 3,435,823 A | 4/1969 | Edwards |
| 3,445,086 A | 5/1969 | Quinn |
| 3,454,286 A | 7/1969 | Anderson et al. |
| 3,546,996 A | 12/1970 | Grijalva et al. |
| 3,559,641 A | 2/1971 | Lay |
| 3,561,537 A | 2/1971 | Dix et al. |
| 3,613,732 A | 10/1971 | Willson et al. |
| 3,620,212 A | 11/1971 | Fannon, Jr. et al. |
| 3,659,625 A | 5/1972 | Coiner et al. |
| 3,725,835 A | 4/1973 | Hopkins et al. |
| 3,789,838 A | 2/1974 | Fournier et al. |
| 3,849,756 A | 11/1974 | Hickling |
| 3,888,975 A | 6/1975 | Ramwell |
| 3,913,572 A | 10/1975 | Wheeler |
| 3,918,443 A | 11/1975 | Vennard et al. |
| 3,974,844 A | 8/1976 | Pimentel |
| 4,055,955 A | 11/1977 | Johnson |
| 4,063,831 A | 12/1977 | Meuret |
| 4,072,159 A | 2/1978 | Kurosawa |
| 4,096,993 A | 6/1978 | Behr |
| 4,145,764 A | 3/1979 | Kuzuki et al. |
| 4,151,064 A | 4/1979 | Kuehnle |
| 4,176,719 A | 12/1979 | Bray |
| 4,177,327 A | 12/1979 | Mathews |
| 4,195,773 A | 4/1980 | Ogden |
| 4,243,963 A | 1/1981 | Jameel et al. |
| 4,265,684 A | 5/1981 | Boll |
| 4,279,190 A | 7/1981 | Hummel |
| 4,279,790 A | 7/1981 | Nakajima |
| 4,340,049 A | 7/1982 | Munsch |
| 4,434,855 A | 3/1984 | Given, Jr. et al. |
| 4,485,545 A | 12/1984 | Caverly |
| 4,501,058 A | 2/1985 | Schutzler |
| 4,524,343 A | 6/1985 | Morgan et al. |
| 4,549,717 A | 10/1985 | Dewaegheneire |
| 4,551,974 A | 11/1985 | Yaeger et al. |
| 4,553,393 A | 11/1985 | Ruoff |
| 4,558,715 A | 12/1985 | Walton et al. |
| 4,567,549 A | 1/1986 | Lemme |
| 4,585,209 A | 4/1986 | Aine et al. |
| 4,589,179 A | 5/1986 | Hulting, Jr. |
| 4,596,483 A | 6/1986 | Gabriel et al. |
| 4,619,284 A | 10/1986 | Delarue et al. |
| 4,654,191 A | 3/1987 | Krieg |
| 4,684,913 A | 8/1987 | Yaeger |
| 4,706,758 A | 11/1987 | Johnson |
| 4,753,465 A | 6/1988 | Dalby |
| 4,821,997 A | 4/1989 | Zdeblick |
| 4,823,607 A | 4/1989 | Howe et al. |
| 4,824,073 A | 4/1989 | Zdeblick |
| 4,848,388 A | 7/1989 | Waldbusser |
| 4,854,797 A | 8/1989 | Gourd |
| 4,864,824 A | 9/1989 | Gabriel et al. |
| 4,893,655 A | 1/1990 | Anderson |
| 4,896,728 A | 1/1990 | Wolff et al. |
| 4,943,032 A | 7/1990 | Zdeblick |
| 5,060,888 A | 10/1991 | Vezain et al. |
| 5,061,137 A | 10/1991 | Gourd |
| 5,061,914 A | 10/1991 | Busch et al. |
| 5,069,419 A | 12/1991 | Jerman |
| 5,072,288 A | 12/1991 | MacDonald et al. |
| 5,102,276 A | 4/1992 | Gourd |
| 5,114,504 A | 5/1992 | AbuJudom, II et al. |
| 5,116,252 A | 5/1992 | Hartman |
| 5,117,916 A | 6/1992 | Ohta et al. |
| 5,119,555 A | 6/1992 | Johnson |
| 5,129,753 A | 7/1992 | Wesley et al. |
| 5,160,233 A | 11/1992 | McKinnis |
| 5,190,546 A | 3/1993 | Jervis |
| 5,192,147 A | 3/1993 | McCloskey |
| 5,211,371 A | 5/1993 | Coffee |
| 5,218,998 A | 6/1993 | Bakken et al. |
| 5,245,738 A | 9/1993 | Johnson |
| 5,309,717 A | 5/1994 | Minch |
| 5,312,152 A | 5/1994 | Woebkenberg, Jr. et al. |
| 5,325,880 A | 7/1994 | Johnson et al. |
| 5,344,117 A | 9/1994 | Trah et al. |
| 5,364,046 A | 11/1994 | Dobbs et al. |
| 5,494,113 A | 2/1996 | Polan |
| 5,502,982 A | 4/1996 | Venetucci |
| 5,543,349 A | 8/1996 | Kurtz et al. |
| 5,605,543 A | 2/1997 | Swanson |
| 5,619,177 A | 4/1997 | Johnson et al. |
| 5,622,225 A | 4/1997 | Sundholm |
| 5,640,217 A | 6/1997 | Hautcoeur et al. |
| 5,641,364 A | 6/1997 | Golberg et al. |
| 5,658,515 A | 8/1997 | Lee et al. |
| 5,676,356 A | 10/1997 | Ekonen et al. |
| 5,695,504 A | 12/1997 | Gifford, III et al. |
| 5,714,690 A | 2/1998 | Burns et al. |
| 5,722,989 A | 3/1998 | Fitch et al. |
| 5,771,742 A | 6/1998 | Bokaie et al. |
| 5,772,378 A | 6/1998 | Keto-Tokoi |
| 5,796,152 A | 8/1998 | Carr et al. |
| 5,819,749 A | 10/1998 | Lee et al. |
| 5,825,275 A | 10/1998 | Wuttig et al. |
| 5,837,394 A | 11/1998 | Schumm, Jr. |
| 5,840,199 A | 11/1998 | Warren |
| 5,850,837 A | 12/1998 | Shiroyama et al. |
| 5,867,302 A | 2/1999 | Fleming |
| 5,903,099 A | 5/1999 | Johnson et al. |
| 5,916,178 A | 6/1999 | Noone et al. |
| 5,924,492 A | 7/1999 | Kikuchi et al. |
| 5,930,651 A | 7/1999 | Terasawa |
| 5,960,812 A | 10/1999 | Johnson |
| 6,042,553 A | 3/2000 | Solar et al. |
| 6,072,617 A | 6/2000 | Henck |
| 6,073,700 A | 6/2000 | Tsuji et al. |
| 6,075,239 A | 6/2000 | Aksyuk et al. |
| 6,080,160 A | 6/2000 | Chen |
| 6,084,849 A | 7/2000 | Durig et al. |
| 6,101,164 A | 8/2000 | Kado et al. |
| 6,110,204 A | 8/2000 | Lazarov et al. |
| 6,123,153 A | 9/2000 | Finnegan |
| 6,124,523 A | 9/2000 | Banas et al. |
| 6,126,371 A | 10/2000 | McCloskey |
| 6,129,153 A | 10/2000 | Joung |
| 6,139,143 A | 10/2000 | Brune et al. |
| 6,195,478 B1 | 2/2001 | Fouquet |
| 6,203,715 B1 | 3/2001 | Kim et al. |
| 6,229,640 B1 | 5/2001 | Zhang |
| 6,247,493 B1 | 6/2001 | Henderson |
| 6,277,133 B1 | 8/2001 | Kanesaka |
| 6,284,067 B1 | 9/2001 | Schwartz et al. |
| 6,352,494 B2 | 3/2002 | McAlonan |
| 6,358,380 B1 | 3/2002 | Mann et al. |
| 6,386,507 B2 | 5/2002 | Dhuler et al. |
| 6,406,605 B1 | 6/2002 | Moles |
| 6,407,478 B1 | 6/2002 | Wood et al. |
| 6,410,360 B1 | 6/2002 | Steenberge |
| 6,447,478 B1 | 9/2002 | Maynard |
| 6,451,668 B1 | 9/2002 | Neumeier et al. |
| 6,454,913 B1 | 9/2002 | Rasmussen et al. |
| 6,470,108 B1 | 10/2002 | Johnson |
| 6,475,261 B1 | 11/2002 | Matsumoto et al. |
| 6,524,322 B1 | 2/2003 | Berreklouw |
| 6,533,905 B2 | 3/2003 | Johnson et al. |
| 6,537,310 B1 | 3/2003 | Palmaz et al. |
| 6,582,985 B2 | 6/2003 | Cabuz et al. |
| 6,592,724 B1 | 7/2003 | Rasmussen et al. |
| 6,596,102 B2 | 7/2003 | Homma |
| 6,605,111 B2 | 8/2003 | Bose et al. |
| 6,614,570 B2 | 9/2003 | Johnson et al. |
| 6,620,634 B2 | 9/2003 | Johnson et al. |
| 6,624,730 B2 | 9/2003 | Johnson et al. |
| 6,669,794 B1 | 12/2003 | Bellouard et al. |
| 6,669,795 B2 | 12/2003 | Johnson et al. |
| 6,672,502 B1 | 1/2004 | Paul et al. |
| 6,688,828 B1 | 2/2004 | Post |
| 6,729,599 B2 | 5/2004 | Johnson |
| 6,742,761 B2 | 6/2004 | Johnson et al. |
| 6,746,890 B2 | 6/2004 | Gupta et al. |

| | | | |
|---|---|---|---|
| 6,771,445 B1 | 8/2004 | Hamann et al. | |
| 6,790,298 B2 | 9/2004 | Johnson et al. | |
| 6,811,910 B2 | 11/2004 | Tsai et al. | |
| 6,840,329 B2 | 1/2005 | Kikuchi et al. | |
| 6,843,465 B1 | 1/2005 | Scott | |
| 6,852,132 B1 | 2/2005 | Houser et al. | |
| 6,908,275 B2 | 6/2005 | Nelson et al. | |
| 6,918,545 B2 | 7/2005 | Franson et al. | |
| 6,920,966 B2 | 7/2005 | Buchele et al. | |
| 6,955,187 B1 | 10/2005 | Johnson | |
| 7,022,173 B2 | 4/2006 | Cummings et al. | |
| 7,040,323 B1 | 5/2006 | Menchaca et al. | |
| 7,044,596 B2 | 5/2006 | Park | |
| 7,073,504 B2 | 7/2006 | Callister et al. | |
| 7,084,726 B2 | 8/2006 | Gupta et al. | |
| 7,201,367 B2 | 4/2007 | Wietharn | |
| 7,736,687 B2 | 6/2010 | Sims et al. | |
| 7,793,911 B2 | 9/2010 | Fontana et al. | |
| 2001/0023010 A1 | 9/2001 | Yamada et al. | |
| 2002/0018325 A1 | 2/2002 | Nakatani et al. | |
| 2002/0062154 A1 | 5/2002 | Ayers | |
| 2002/0106614 A1 | 8/2002 | Prince et al. | |
| 2003/0002994 A1 | 1/2003 | Johnson et al. | |
| 2003/0078465 A1 | 4/2003 | Pai et al. | |
| 2003/0170130 A1 | 9/2003 | Johnson | |
| 2004/0083006 A1 | 4/2004 | Ellingsen | |
| 2004/0200551 A1 | 10/2004 | Brhel et al. | |
| 2004/0221614 A1 | 11/2004 | Holemans et al. | |
| 2004/0243219 A1 | 12/2004 | Fischer et al. | |
| 2004/0249399 A1 | 12/2004 | Cinquin et al. | |
| 2005/0113933 A1 | 5/2005 | Carter et al. | |
| 2006/0118210 A1 | 6/2006 | Johnson | |
| 2006/0204738 A1 | 9/2006 | Dubrow et al. | |
| 2006/0213522 A1 | 9/2006 | Menchaca et al. | |
| 2006/0232374 A1 | 10/2006 | Johnson | |
| 2006/0240953 A1 | 10/2006 | Shahinpoor | |
| 2007/0137740 A1 | 6/2007 | Johnson et al. | |
| 2007/0207321 A1 | 9/2007 | Abe et al. | |
| 2007/0246233 A1 | 10/2007 | Johnson | |
| 2009/0183986 A1 | 7/2009 | Johnson et al. | |

FOREIGN PATENT DOCUMENTS

| | | |
|---|---|---|
| EP | 0310439 | 4/1989 |
| EP | 1122526 | 8/2001 |
| EP | 1238600 | 9/2002 |
| GB | 2187951 | 9/1987 |
| JP | 48071713 A * | 9/1973 |
| JP | 57161031 | 10/1982 |
| JP | 58088200 A | 5/1983 |
| JP | 59179771 | 10/1984 |
| JP | 04099832 A * | 3/1992 |
| JP | 07090624 | 4/1995 |
| JP | 10173306 | 6/1998 |
| JP | 2000185999 A | 7/2000 |
| SU | 1434314 | 10/1988 |
| WO | WO 98/53362 | 11/1998 |
| WO | WO99/16387 A1 | 4/1999 |
| WO | WO99/62432 | 12/1999 |
| WO | WO0004204 | 1/2000 |
| WO | WO03/052150 | 6/2003 |
| WO | WO2005/108635 | 11/2005 |
| WO | WO2006/019943 | 2/2006 |

OTHER PUBLICATIONS

Written translation of JP 48-071713 published Sep. 1973.* http://www.algor.com/news_pub/tech_reports/2005/rubber&foam/default.asp.

Christian et al.; The application of shape memory actuators in anthropomorphic upper limb prostheses; Artif. Organs; vol. 27; No. 5; pp. 473-477; 2003.

Gill et al.; Three-Dimensional Thin-Film Shape Memory Alloy Microactuator With Two-Way Effect; Journal of Microelectromechanical Sys.; vol. 11; No. 1; Feb. 2002; pp. 68-77.

Dario et al.; Shape memory alloy microactuators for minimal invasive surgery; Proceedings of SMST-94 Conference; pp. 427-433; Pacific Grove CA; 1994.

Johnson, A. D.; Vacuum-deposited TiNi shape memory film: Characterization and applications in microdevices; J. Micromech. Microeng.; vol. 1; pp. 34-41; 1991.

Krulevitch et al.; Thin film shape memory alloy microactuators; J. Micromech. Microeng.; vol. 5; No. 4; 26 pgs.; 1996.

Schetky, L.M.; Shape-memory alloys; Scientific American, pp. 74-82; 1979.

Johnson et al.; U.S. Appl. No. 12/503,614 entitled "Sprinkler valve with active actuation," filed Jul. 15, 2009.

Brice et al.; Crystal Growth; Ullmann's Encyclopedia of Industrial Chemistry; 2007; Wiley-VCH Verlag GmBH; pp. 1, 29-42, 50.

US 5,772,989, 3/1998, Fitch et al. (withdrawn).

Johnson, David et al.; U.S. Appl. No. 10/972,745 entitled "Non-explosive releasable coupling device," filed Oct. 25, 2004.

Xiaogdang, MA; U.S. Appl. No. 10/972,759 entitled "Magnetic data storage system," filed Oct. 25, 2004.

Johnson, David et al.; U.S. Appl. No. 11/006,501 entitled "Anastomosis device and method," filed Dec. 6, 2004.

Johnson, David et al.; U.S. Appl. No. 11/041,185 entitled "Single crystal shape memory alloy devices and methods," filed Jan. 24, 2005.

Johnson, David; U.S. Appl. No. 11/415,885 entitled "Eyeglass frame," filed May 2, 2006.

Johnson, David; U.S. Appl. No. 11/420,157 entitled "Shape memory allow thin film, method of fabrication, and articles of manufacture," filed May 24, 2006.

Johnson, David; U.S. Appl. No. 11/526,138 entitled "Constant load bolt," filed Sep. 22, 2006.

Johnson, David; U.S. Appl. No. 11/859,697 entitled "Constant load fastener," filed Sep. 21, 2007.

Johnson, David et al.; U.S. Appl. No. 11/949,663 entitled "Hyperelastic shape setting devices and fabrication methods," filed Dec. 3, 2007.

I. E.Viahhi; Robototechnic Constructions Based on CU-AL-NI Single Crystal Actuators; Proceedings of Second International Conference on Shape Memory and Superelastic Technologies; 1997; United States.

Pauling, Linus, College Chemistry, second edition, W.H. Freeman and Company, San Francisco, 1955, pp. 81-91.

Buchaillot L. et al., "Thin film of titanium/nickel shape memory alloy for multi-degree of freedom microactuators", Seisan Kenkyu, vol. 51, No. 8, 1999, pp. 22-23.

Johnson A. D. et al., "Application of shape memory alloys: advantages, disadvantages, and limitations", Micromachining and Microfabrication Process Technology VII, 22-4 Oct. 2001, San Francisco, CA, USA, vol. 4557, 2001, pp. 341-351.

Takabayashi et al., "Reversible shape memory alloy film fabricated by RF sputtering", Materials and Manufacturing Processes, vol. 13, No. 2, 1998, pp. 275-286.

Martynov, V., "TiNi thin films for microactuators and microdevices: sputter deposition and processing techniques", Thermec' 2003, Internat'l Conf. on Processing and Manufacturing of Advanced Materials, Jul. 7-11, 2003, Leganes, Madrid, Spain, Materials Science Forum, Jul. 7, 2003 vol. 426-432; pp. 3475-3480.

Johnson, Alfred David; U.S. Appl. No. 12/182,119 entitled "Method and devices for preventing restenosis in cardiovascular stents," filed Jul. 29, 2008.

Johnson, David et al.; U.S. Appl. No. 12/019,553 entitled "Frangible shape memory alloy fire sprinkler valve actuator," filed Jan. 24, 2008.

Johnson, Alfred David; U.S. Appl. No. 12/325,722 entitled "Biocompatible copper-based single-crystal shape memory alloys," filed Dec. 1, 2008.

Johnson, A. David; U.S. Appl. No. 12/952,002 entitled "Hyperelastic shape setting devices and fabrication methods," filed Nov. 22, 2010.

Antonov et al.; New advances and developments in the Stepnakov method for the growth of shaped crystals; Crystallography Reports; vol. 47; Suppl. 1; 2002; pp. S43-S52.

ElastametTM brochure from New Discovery Metals; 2007.

ElastametTM website screen capture, accessed Jul. 23, 2008.

Fu et al.; The growth characteristics with a shape memory effect; J. Phys.: Condens. Matter; vol. 4; 1992; pp. 8303-8310.

Morgan; Medical shape memory alloy applications—the market and its products; Materials Science and engineering A 378; 2004; pp. 16-23.

Qingfu et al.; Stabilisation of martensite during training of Cu-Al-Ni single crystals; Journal de Physique IV; Collloqu C2; Supplement to the Journa de Physique III; vol. 5; Feb. 1995; pp. 181-186.

Recarte et al.; Influence of Al and Ni concentration on the martensitic transformation in Cu-Al-Ni shape-memory alloys; Metallurgical and MaterialsTransactions A; vol. 33A; Aug. 2002; pp. 2581-2591.

Sittner et al.; Stress induced martensitic transformations in tension/torsion of CuAlNi single crystal tube; Scripta Materialia; vol. 48; 2003; pp. 1153-1159.

Sutuo et al.; Development of medical guide wire of Cu-Al-Mn-base superelastic alloy with functionally graded characteristics; Mater Res Part B: Appl Biomater; vol. 69B; 2004; pp. 64-69.

Wang et al.; Temperature memory effect in CuAlNi single crystalline and CUZnAl polycrystalline shape memory alloys; Thermochimica Acta; vol. 448; 2006; pp. 69-72.

Yahia et al.; Bioperformance of shape memory alloy single crystals; Bio-Medical Materials and Engineering; vol. 16; 2006; pp. 101-118.

Zhang et al.; Nanoscale pseudoelasticity of single-crystal Cu-Al-Ni shape-memory alooy induced by cyclic nanoindentation; J Mater Sci; vol. 41; 2006; pp. 5021-5024.

Zhang et al.; The variant selection criteria in single-crystal CuAlNi shape memory alloys; Smart Mater. Struct.; vol. 9; 2000; pp. 571-581.

Zhdanov et al.; Thermal stresses in tubes, produced from a melt by the Stepanov method, during their colling; Journal of Engineering Physics and Thermophysics; vol. 68; No. 1; 1995; pp. 80-89.

* cited by examiner

METHOD OF ALLOYING REACTIVE COMPONENTS

CROSS-REFERENCE TO RELATED APPLICATIONS

This application claims the benefit of U.S. Provisional Patent Application Ser. No. 60/868,116, titled "METHOD OF ALLOYING REACTIVE ELEMENTAL COMPOSITIONS," filed on Dec. 1, 2006.

STATEMENT AS TO FEDERALLY SPONSORED RESEARCH

This invention was made with Government support under Contract No. W31P4Q-05-C-0158 awarded by DARPA. The Government has certain rights in the invention.

BACKGROUND OF THE INVENTION

1. Field of the Invention

The invention is directed to an improved method of fabricating alloys composed of elements (or other alloys) that have very different melting temperatures and whose components strongly react chemically with each other, especially alloys whose proper function requires strict stoichiometry. The invention is more particularly directed to an improved method of fabricating shape memory alloys.

2. Background of the Invention

The making of alloys is an ancient art. Bronze is stronger than copper alone as a result of alloying copper with zinc, tin, and other elements. Steel is a significant improvement over iron alone, and exhibits greater strength and toughness. Alloys are developed for specific requirements such as resistance to corrosion. Certain alloys exhibiting shape memory properties and superelasticity are used in aerospace, consumer products, and medical devices.

Shape memory alloys (SMAs) are intermetallic compounds that undergo an energetic phase change such that the mechanical properties are very different at temperatures above and below the phase transformation temperature. The most comment SMAs in practical use are Ti-Ni alloys, Cu-based alloys and Fe-based alloys. It has been acknowledged that there are problems with the fabrication of commercial SMAs. In particular, shifting the content of a component, such as Nickel, can result in a change in the martensite start temperature or the transformation finish temperature. See, Shape Memory Materials, J. Otsuka and C. M. Wayman (Eds.), Oxford University Press (1999).

The higher temperature phase, generally referred to as austenite, has a simpler crystal structure and is more rigid than the low temperature phase, called martensite. A body that is deformed (stretched or bent) while in the low temperature phase will recover its original shape when heated to above its transformation temperature, giving rise to a shape memory. In shape memory alloys, the phase transformation from austenite to martensite can be induced by stress. When the stress is removed, the body reverts to its original austenite and consequently recovers its shape. This phenomenon is called superelasticity.

The strain recovery is much greater in shape memory alloys than in ordinary metals. Single crystal SMA may recover as much as the theoretical maximum. For single crystal CuAlNi this is nearly 10 percent strain, which can be described as 'hyperelastic.' Thus, while shape memory alloys transform from one solid crystal structure to another, and are capable of energy storage at greater densities than elastic materials, in hyperelastic transformations, the energy is absorbed and released at nearly constant force, so that constant acceleration is attainable. See also, U.S. Patent Publ. 2006/0118210 to Johnson for Portable energy storage devices and methods.

Useful devices are produced by pulling single crystals of CuAlNi from melt by a method due to Vasily Stepanov. Successful pulling of single crystals requires very pure alloys with very strict composition control.

Ingots for crystal pulling are conventionally made by mixing copper, aluminum, and nickel pellets and heating in a furnace. Conventionally, similarly sized pellets of material comprising the alloy are weighed to the fraction that the material represents in the alloy. The pellets are then mixed together in a crucible and heated until the pellets melt and go into solution. The components then engage in congruent melting. FIG. 1 illustrates a CuAlNi ingot 100 cast using conventional methods. This method has several drawbacks. Since the melting temperatures of the elements are disparate, the individual elements comprising the alloy do not readily mix. As the aluminum is melted in conventional methods (ca 650° C.), it becomes reactive and reacts explosively and exothermically with the copper and nickel. This causes spattering, especially in small ingots, and may result in significant loss of mass during the manufacturing process. Additionally, pellets have a large surface to volume ratio and have oxide surfaces that generate slag. Unless the mixture is stirred mechanically, the components can segregate into layers, as illustrated in FIG. 1. Even if stirred vigorously while melted, it may separate during cooling unless cooling is rapid. If a large amount of alloy (more than a kilogram for example) is melted at a time, some segregation is almost certain to occur because cooling cannot be rapid. While the uneven qualities of the ingot of FIG. 1 are an extreme example for an ingot manufactured using conventional methods, significant segregation of components is not unusual. Segregation leads to variation in composition throughout the ingot that causes difficulty in pulling single crystals. Up to 80% of a batch of ingots have been found to be unusable for pulling single crystal shape memory alloy. Even when single crystals are successfully pulled, the results are not reproducible. The transition temperature of the phase transformation that gives CuAlNi its desirable shape memory properties depends crucially on composition (to 0.1 percent).

A method of overcoming these difficulties is important to the commercial development of hyperelastic alloys. The invention described herein is a method whereby small ingots of CuAlNi can be made with reproducible composition and good crystal growth characteristics.

SUMMARY OF THE INVENTION

The methods of forming alloys described herein takes advantage of the observation that some metals (in particular Al) react with other metals (e.g., Ni and Cu) when heated above their melting temperature (e.g., the melting temperature of Al). Therefore, it is advantageous to arrange the material in thin flat layers (providing large areas of contact between the layers) so that the reaction can take place smoothly and completely leaving less opportunity for undesirable events to take place. This is achieved by stacking 1-mm- thick layers of alternating metals (such as Cu and Al), and alternating these layers with alternating layers of other metals (e.g., Ni with Al), so that the separate layers have large areas of contact. This stacking method may facilitate diffusion of the first, reactive, metal into the other metal(s), allowing the energy of the reaction to elevate the temperature of the mixture over a much larger surface of contact, avoiding inhomogeneities arising from as the explosive-type events that otherwise occur. For example, the formation of alloys of NiAlCu is of particular interest herein, and has been developed with great success. Stacking alternating layers of the more reactive metal such as Al, with other metals (such as Cu and Ni) in thin layers before heating may allow and even enhance diffusion of the reactive metal (e.g., Al) into the other metals (e.g., into the Cu and into Ni), and the energy of the reaction may further elevate the temperature of the mixture over the entire surface of contact, avoiding the violent explosive-type events that may occur if difference in temperatures occur in nearby regions.

Although the method described herein are directed mostly to alloying materials by forming layers of elemental metals (e.g, Ni, Al, Cu), it should be recognized that the method may also be used with other elemental metals and with alloys of metals. An alloy may be formed as described herein by alternating layers of elemental metals and layers of alloys, or by alternating layers of alloys.

This invention also provides for devices and apparatuses having at least one component made of a single crystal shape memory alloy (SMA) formed from an ingot made according to the method of the invention. Single crystal SMAs are hyperelastic SMA that have properties enabling components made from them to undergo large recoverable distortions. Such distortions can be at least an order of magnitude greater than that which could be obtained if the component were made of non-SMA metals and alloys, and nearly an order of magnitude greater than can be obtained with polycrystalline SMA materials. Devices and apparatus having components comprised of hyperelastic SMA can serve as: actuators for the active deployment of structures such as booms, antennae and solar panels; actuators for releasing door locks, moving mirrors and fuel injectors; flexures; constant force springs; connectors; dampeners; valves; microchip substrates; support members; non-explosive separation devices; catheter guide wires; laproscopic instruments; medical implants such as stents; micro-connectors; switches; circuit breakers; electronic test equipment including probe tips; flexible electric cables; heat conductors; consumer products such as safety valves, eyeglass frames and cellular telephone antennae; and many other devices and apparatus in which large recoverable distortions of a component or components can be advantageous.

One aspect of the invention is directed to a method of alloying dissimilar materials. The method comprises the steps of: obtaining a plurality dissimilar materials configured to provide large areas of contact between the plurality of materials; layering the dissimilar materials in an alternating pattern; heating the dissimilar materials; melting the dissimilar materials; mixing the melted dissimilar materials; and cooling the mixed dissimilar materials to form an ingot. Example of dissimilar materials include materials selected from the group consisting of: aluminum, copper, nickel, manganese, zinc, and titanium, nickel alloys, and copper alloys. Of course, other materials (both elemental materials and alloys) may be used. As is known to those of skill in the art, alloys may be formed by combining two or more elements in a ratio that is not the desired final ratio, then diluting this combination by adding other ingredients. Thus alloys containing any of the elemental materials described above (e.g., nickel, aluminum, copper, manganese, zinc, titanium, etc.) may be used as well as the elemental material or other alloys including the same elemental materials. Even though alloys may include the same elemental materials, they may still be considered dissimilar materials if the makeup (ratio, and/or concentration) of materials is different.

In one embodiment of the invention, the method also includes the step of reacting the dissimilar materials before and during melting. In still another embodiment, the plurality of dissimilar materials include one or more sheets of aluminum and further wherein one or more sheets of aluminum begins to melt prior to a melting of any other sheets of materials. Where one or more sheets of aluminum are used, these sheets can be layered with one or more layers of copper and nickel. An aspect of the invention also includes nesting a material within an adjacent material. During the heating step, the materials used as starting materials do not erupt, or only nominally erupt. The arrangement of the materials into layers (e.g., the order of the layers) may be based one or more properties of the materials, such as reactivity, melting temperature, etc.

In another aspect of the invention, a method of alloying metals having a phase form dependent upon temperature is provided. The method may include the steps of: obtaining a plurality of dissimilar materials configured to provide large areas of contact between the plurality of materials; layering the dissimilar materials in an alternating pattern; heating the dissimilar materials; melting the dissimilar materials; mixing the melted dissimilar materials; and cooling the mixed dissimilar materials to form an ingot. The dissimilar materials may include materials selected from the group consisting of: aluminum, copper, nickel, manganese, zinc, and titanium. In one embodiment of the invention, the method also includes the step of reacting the dissimilar materials before melting. In still another embodiment, the plurality of dissimilar materials includes one or more sheets of aluminum, wherein the one or more sheets of aluminum begins to melt prior to a melting of any other sheets of materials. Where one or more sheets of aluminum are used, these sheets can be layered with one or more layers of copper and nickel. One aspect of the invention also includes nesting the material within an adjacent material. During the heating step, the materials used as starting materials do not erupt, or only nominally erupt.

Still another aspect of the invention is directed to a method of making an ingot where dissimilar materials do not segregate while cooling, or only nominally segregate. Ingots manufactured according to the method of the invention ideally have a uniform composition of greater than 50%, more preferably greater than 80%, even more preferably greater than 90%, and ideally at least 99% uniform. Ingots manufactured according to the invention have a weight greater than 95% of the weight of the starting materials, greater than 50%, more preferably greater than 80%, even more preferably greater than 90%, and typically greater than 99.9%.

In yet another aspect of the invention, a variety of devices manufactured from shape memory alloys are contemplated. The devices comprise a mechanical component, wherein the mechanical component is formed of a hyperelastic material manufactured from an alloyed ingot formed from obtaining a plurality dissimilar materials configured to provide large areas of contact between the plurality of materials; heating the sheets of material; melting the sheets of material; mixing the melted sheets of material; and cooling the mixed metals to form an ingot.

INCORPORATION BY REFERENCE

All publications and patent applications mentioned in this specification are herein incorporated by reference in their entirety to the same extent as if each individual publication or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Figure 2:
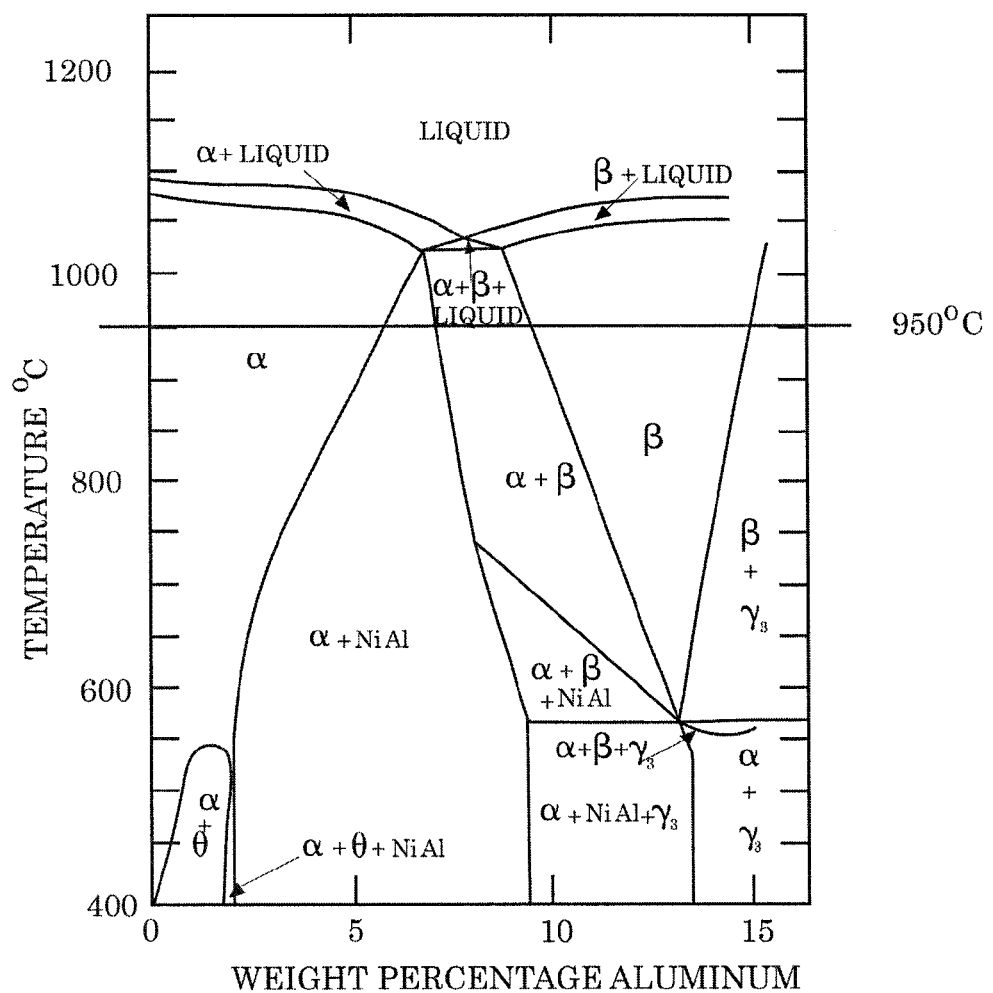
FIG. 2 is a phase diagram for copper-aluminum-nickel with a fixed three percent nickel.

Described herein are methods for forming single-crystal shape-memory alloys (SMAs) with high reliability and control by alloying thin films of material together. In particular, described herein are methods of forming AlCuNi SMAs by first producing high-quality seeds (ingots) of copper, aluminum, and nickel to produce for pulling single crystal shape memory alloys, in particular superelastic or hyperelastic alloys. These methods may also applicable to a wide range of alloys in which one or more of the components are reactive. The method is an improvement upon traditional methods such as mixing and melting pellets. In this improved method, a reactive layer (e.g., aluminum) is provided in thin flat layers between layers of other materials (e.g., copper and layers of nickel). When the stacked layers are vacuum heated in a crucible to the melting temperature of the reactive layer, it becomes reactive and chemically bonds to the other layers, and may form eutectics that, as the temperature is further increased, melt homogeneously and congruently at temperatures below the melting temperatures of copper and nickel. Oxidation and evaporation are greatly reduced compared to other methods of alloying, and loss of material from turbulence is minimized FIG. 2 illustrates a phase diagram for copper-aluminum-nickel with a fixed 3% nickel. This phase diagram illustrates the phase changes that occur when an ingot is made according to the methods of the invention. After heating to melting temperature the three elemental components are dissolved in each other. As the temperature decreases, saturation occurs and one or more of the elements start to precipitate out of solution. If cooling is very slow, the materials can even segregate into layers. For success in pulling single crystals, the melt must be homogeneous. A boule pulled from melt by the Stepanov method, which is known by persons of skill in the art, undergoes some degree of precipitation because cooling after crystallization is gradual. In order to obtain an alloy with optimal properties, the material, after being pulled, is heated to 950° C. and then quenched. Single crystal shape memory alloy materials formed in this manner take a remarkable amount of deformation without fracture, and return to precisely their original shape in the high-temperature phase.

Method of Fabricating an Ingot of Alloyed Material

Figure 3:
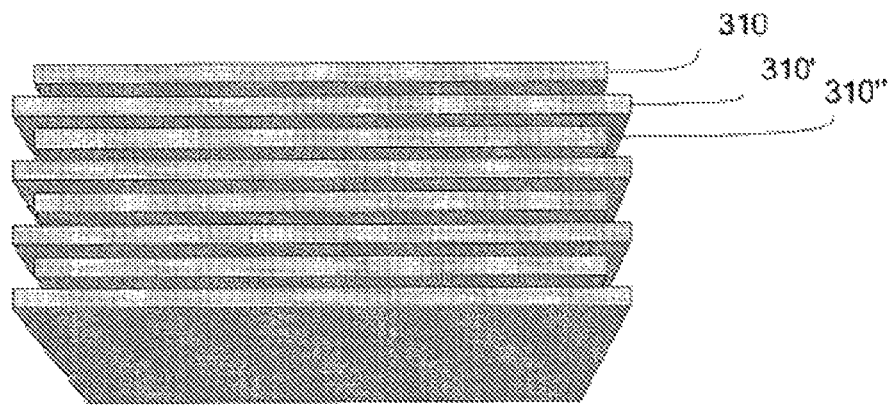
FIG. 3 is a diagram depicting the layering of materials for forming ingots according to the method of the invention.

Described herein is a method of fabricating an ingot of alloyed material which overcomes the yield and composition issues experienced when making ingots according to current methods. The method enables alloying dissimilar materials to form an ingot wherein greater than 50% of the ingots manufactured can be used to pull a single crystal SMA (as discussed below). More particularly, the method enables alloying dissimilar materials to form an ingot wherein greater than 90%, more preferably greater than 95%, of the ingots manufactured can be used to pull a single crystal SMA. Further, the yield of material formed during this process is also greater than 90%, more preferably greater than 95%. In making an ingot a plurality of sheets of a two or more materials is obtained. Persons of skill in the art of manufacturing ingot alloys will be familiar with suitable materials, which include, but is not limited to, aluminum, copper, nickel, manganese, zinc, and titanium. Sheets of suitably sized materials 310, 310', 310" are layered, such as illustrated in FIG. 3. Suitably sized materials are, for example, approximately 2 inches by 2 inches square with a thickness that is much less than the length and width, but which may vary from material to material depending on the desired percent-composition of any particular material in the ingot. The layers may be any appropriate thickness, and the different layers may have different thicknesses.

The layers can be further configured to facilitate nesting of one or more layers within adjacent layers. Typically, the sheets will be layered in an alternating pattern so that, for example, two sheets of aluminum are not layered adjacent each other, and each layer of copper or nickel is sandwiched between two layers of aluminum. The layered sheets are placed in a crucible, such as a graphite crucible, and then put into an oven. Depending upon the starting materials used for the alloy, the oven can be a vacuum or inert gas environment in order to compensate for the fact that some materials, such as titanium, are very reactive to oxygen when molten.

The sheets of material are then heated so that they melt. For example, the material is gradually heated to more than 1100° C. As aluminum begins to melt at about 660° C. it reacts with the copper and nickel with which it is in intimate contact and a eutectic is formed with a melting temperature of about 1000° C. To ensure homogeneity, the melt is vigorously stirred. Once the material is cooled in flowing argon, it hardens into an ingot which can be used as described in more detail below.

This method of making an ingot of alloy produces an ingot where the component materials do not, or only nominally, segregate while cooling. Alloy ingots produced according to this method also have a uniform composition of greater than 99%, with very small precipitates that dissolve upon heating. Additionally, during the process of making the alloy ingot, the sheets of materials tend not to erupt during heating, unlike ingots formed from pellets, so very little material is lost during the casting process: ingot alloys produced according to these methods achieve greater than 95%, and typically greater than 99.5%, of the weight of the starting materials. Thus, where 1000 g of materials (e.g., Al, Cu, Ni) are used to make an ingot, the final ingot weighs more than 950 g, and more often greater than 995 g.

Figure 4:
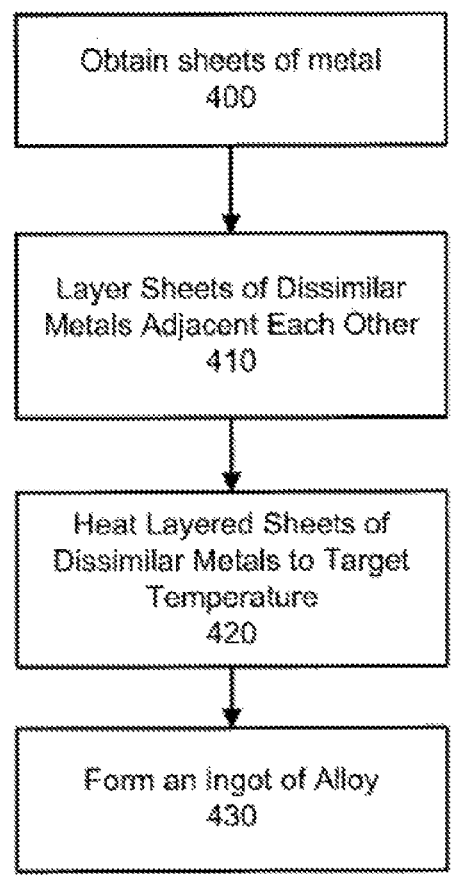
FIG. 4 is a flow chart showing the steps of the method for making an alloy ingot according to a method of the invention.

Thus, in its simplest incarnation, as shown in FIG. 4, sheets of different metals 400 are layered adjacent one another 410, the composition is heated 420 and an ingot alloy is formed 430.

In a specific example, an ingot having a composition of CuAlNi suitable for pulling single crystals (described below) is 81.4 weight percent Cu, 14.1 weight percent Al, and 4.5 weight percent Ni. This composition produces crystals having a phase transformation with an Austenite finish temperature of approximately −10° C. To make a one kg ingot of alloyed material, 814 gm Cu, 141 gm Al, and 45 gm Ni are prepared in the form of squares 2 in on a side and 1 mm thick. As illustrated in FIG. 3, these squares 310, 310', 310" are stacked in a suitably sized graphite crucible (not shown), alternating Al with Cu and Ni. The crucible is placed in a vacuum chamber, evacuated to less than 5×10e4 Torr, and heated in about 5 minutes to 1100° C. The mixture is stirred with a graphite paddle, then allowed to cool to room temperature in about 60 minutes or less. As illustrated, the squares of material can be sized such that the squares are approximately the same length, width, and thickness; alternatively the material can be sized such that alternating squares are larger in length, width and/or thickness than an adjoining square of material (as illustrated).

Figure 1:
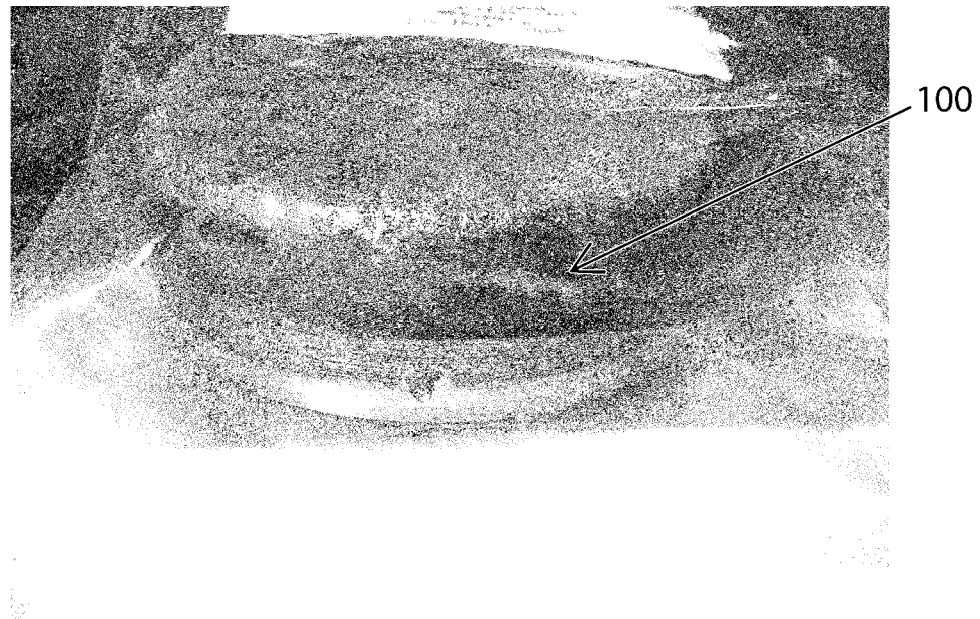
FIG. 1 is a picture of an ingot of shape memory alloy made according to conventional methods wherein there is segregation of components.
Figure 5:
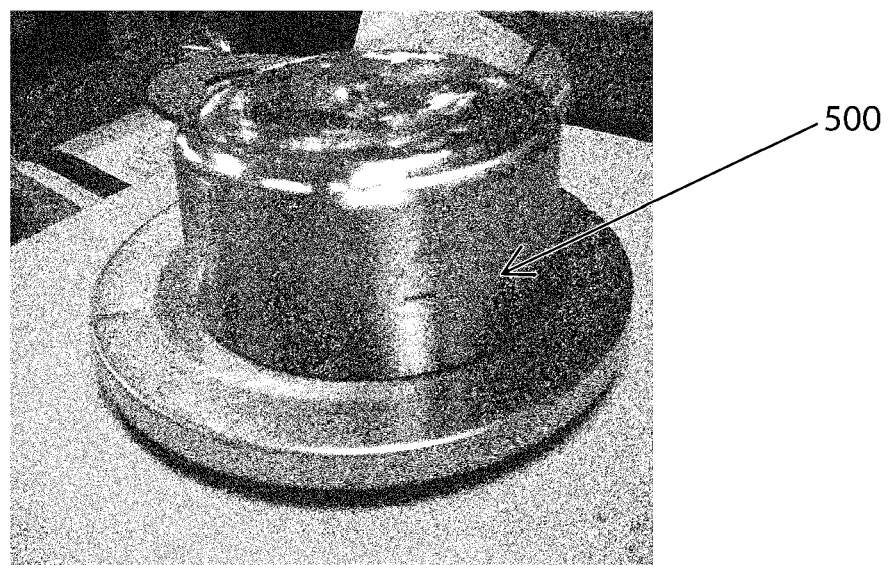
FIG. 5 is a picture of an ingot of shape memory alloy made according the method described herein.

Turning back to FIG. 1, FIG. 1 illustrates an ingot manufactured according to methods currently used in the art. In contrast, FIG. 5 illustrates an ingot manufactured according to the methods of the invention. As is evident from the pictures, the ingot of FIG. 1 has a rough, blotchy non-uniform appearance, while the ingot of FIG. 5 has a smooth, uniform appearance.

Method of Fabricating Single Crystal SMA

Since single crystals cannot be processed by conventional hot or cold mechanical formation without breaking single crystallinity, a special procedure is required for shaping single crystals in the process of growth as the crystal is pulled from melt, resulting in finished shape as described in WO2005/108635. In order to consistently obtain a single crystal, the ingot from which the single crystal is pulled much be uniformly high in quality. When pulling crystals using ingots made according to current techniques, only 1-2 of 5 ingots (i.e., less than 40%) are of sufficient quality that the ingots can be used to pull single crystal SMAs. In contrast, using an ingot made according to the techniques described herein result in producing more than 80% of usable ingots. In most instances, more than 90% of the ingots are usable, greater than 95% of the ingots are usable, and most often up to 100% of the ingots are usable.

Single crystal SMA is made in a special crystal-pulling apparatus. A seed of the desired alloy is lowered into a crucible containing a melted ingot of the alloy composition, and gradually raised up. Surface tension pulls the melted metal along with the seed. The rising column cools as it leaves the surface of the melt and crystallizes a short distance above the surface of the melt. The rate of pulling is controlled to correspond with the rate of cooling so that a solid crystal is formed at a region that becomes a crystallization front. This front remains stationary while the crystal, liquid below and solid above, travels through it. The top surface of the melt can contain a die (of the desired cross-sectional shape) that forms the shape of the crystal as it grows. This procedure generally is known as the Stepanov method of making single crystals.

From the Cu-Al-Ni phase diagram, rapid cooling (quenching) of the drawn crystal is necessary for production of single crystal beta phase that has the desired hyperelastic properties. Starting with beta phase at 850-1000 Celsius, if the alloy is cooled slowly, the beta phase precipitates as beta+gamma, and at lower temperatures, as alpha+gamma-2. Single crystal beta phase, which requires that Al remains in solution at room temperature, is formed by rapid cooling in salt water from 850 Celsius. At elevated temperatures, above 300 Celsius, some decomposition gradually occurs; in fact, beta phase is not entirely stable at room temperatures but the time constant for decay is many years.

Devices Manufactured From Alloy Ingots of the Invention

A variety of devices, components of devices and improved devices can be made using the materials described herein. For example, microactuators, miniature valves, electric switches, relays, optical switches, a variety of medical devices, improved stents, stent covers, anastomosis devices, self-expanding stents or stent covers, to name a few. See, for example, the disclosures of U.S. Pat. No. 5,325,880 to Johnson et al. for Shape-Memory Alloy Film Actuated Microvalve; U.S. Pat. No. 5,903,099 to Johnson et al. for Fabrication System, Method and Apparatus for Microelectromechanical Devices; U.S. Pat. No. 5,960,812 to Johnson for Fluid Flow Control Valve; U.S. Pat. No. 6,470,108 to Johnson for Optical Switching Device and Method; U.S. Pat. No. 6,533,905 to Johnson et al. for Method for Sputtering TiNi Shape-Memory Alloys; U.S. Pat. No. 6,614,570 to Johnson et al. for Shutter for Fiber Optic Systems; U.S. Pat. No. 6,642,730 to Johnson et al. for Thin Film Shape Memory Alloy Actuated Microrelay; U.S. Pat. No. 6,669,795 to Johnson et al. for Methods of Fabricating High Transition Temperature SMA, and SMA Materials Made by the Methods; U.S. Pat. No. 6,729,599 to Johnson for Liquid Microvalve; U.S. Pat. No. 6,742,761 to Johnson et al. for Miniature Latching Valve; U.S. Pat. No. 6,746,890 to Gupta et al. for Three Dimensional Thin Film Devices and Methods of Fabrication; U.S. Patent Publications 2003/0170130 to Johnson for Micro-Dosing Pumps and Valves; 2003/0002994 to Johnson et al. for Thin Film Shape Memory Alloy Actuated Flow Controller; 2002/0195579 to Johnson for Liquid Microvalve; 2001/0039449 to Johnson et al. for Thin-Film Shape Memory Alloy Device and Method; and 2002/0071167 to Johnson et al. for Shutter for Fiber Optic Systems; and PCT Publication WO 2005/108635 of TiNi Alloy Company for Single Crystal Shape Memory Alloy Devices and Methods.

In its broadest concept, the present invention provides devices and apparatus having a component made of a single crystal SMA material which has the property of enabling a repeatable strain recovery of as much as 24 percent.

Because the range of strain recovery is so far beyond the maximum strain recovery of both conventional polycrystalline SMA materials and non-SMA metals and alloys, such repeatable strain recovery property of single crystal SMA is referred to herein as hyperelastic. Further, materials exhibiting hyperelastic properties are referred to herein as hyperelastic materials. Also as used herein, the phrase large recoverable distortion means the magnitude of repeatable strain recovery described above for a hyperelastic material.

Within the past two decades, SMA materials have become popular for use as actuators due to their ability to generate substantial stress during shape recovery of large strains during temperature-induced phase transformation. The energy density of such actuators is high compared to other alternatives, such as electromagnetic, electrostatic, bimetals, piezoelectric, and linear and volume thermal expansion effects of ordinary materials. The operating cycle of an SMA actuator includes deformation during or after cooling, and subsequent heating which results in a temperature-induced phase transformation and recovery of the deformation. SMA actuation is favored where relatively large force and small displacements are required in a device that is small in size and low in mass.

Shape memory is the ability of certain alloys to recover plastic deformation, which is based on a diffusionless solid-solid lattice distortive structural phase transformation. The performance of shape memory alloy based actuators strongly depends on the amount of recoverable deformation. In turn, recoverable deformation itself is a function of the lattice distortions which take place during martensitic phase transformation in the particular SMA. For an individual grain (single crystal) of SMA, the amount of possible recoverable strain after uniaxial loading, depends on the particular crystallographic orientation of the deformation tensor relative to the crystallographic axes of the high temperature (austenite) phase and the sign of applied load (tension or compression).

For a given deformation mode, the recoverable strain is strongly orientation dependent, and for the various crystallographic directions it differs by approximately a factor of two.

The recoverable deformation of these polycrystalline SMA alloys, due to the lattice distortion during diffusionless solid-solid phase transition, is substantially lower than is theoretically possible for a given material. The main reason for this is that for a conglomerate of randomly oriented grains (as is normally the case for polycrystalline materials), the average deformation will always be less than the maximum available value for a given grain. The diffusionless nature of phase transitions in SMA results in strict lattice correspondence between the high temperature (austenite) and low temperature (martensite) lattices. As the symmetry of the martensite lattice is lower than that of austenite, maximum deformation in each grain can only be attained in one particular crystallographic direction. This means that for randomly oriented grains (as normally is the case for polycrystalline materials), the average deformation will be at least a factor of two less than the maximum.

The restrictions imposed on a polycrystalline body by the deformation mechanism are another reason for diminished recoverable deformation in polycrystals as compared with a single crystal. To maintain integrity of the polycrystal, deformation of each particular grain has to be less than that corresponding to the theoretical limit for lattice distortion.

Therefore, for polycrystalline material, resultant recovery is the vector sum of particular grain deformations over the whole range of grain orientations, and is significantly smaller than the maximum value for an individual single crystalline grain.

By comparison, recoverable deformation close to the theoretical value (lattice distortion) can be achieved in single crystalline SMA. In addition to the substantially increased recoverable deformation, absence of grain boundaries results in increased strength and longer fatigue life. Specifically, as a single crystal, the strength of the grain for CuAlNi SMA can be as high as 800 MPa with the potential limit for recoverable deformation up to 9 percent and even higher for special deformation modes. An additional advantage of a single crystal SMA is that not only the thermally induced phase transformation may contribute to the recoverable deformation, as in the case for polycrystals, but also the stress-induced martensite-to-martensite phase transitions. Depending on the material, this additional contribution may be up to 15 percent therefore the total theoretical recovery can be as high as 24 percent.

The various device applications contemplated by the invention with hyperelastic single crystal SMA are constrained by the intrinsic properties of the material, and by its behavior during forming and machining and other secondary manufacturing processes. For example, it has been shown that exposure to high temperature and/or stress can lead to recrystallization and the formation of unwanted crystals. The known forming and machining processes which are successful include lathe machining, electro-discharge machining (EDM), grinding, laser cutting, electro-polishing, and the like. These processes can be used to manufacture many basic shapes of the hyperelastic SMA, including rods, ribbons, flexures, coil springs, leaf springs, serrated tubes', rubes, pins and bi-stable elements.

Single crystal shape memory materials have significantly smaller thermal and mechanical hysteresis than polycrystalline materials. This is advantageous since less energy is absorbed in the material on each cycle, less heating occurs and more of the energy is recovered during the shape recovery.

Single crystal SMA hyperelastic components of mechanical devices generally provide a significant advantage over other device components currently available because they enable large displacement at constant force. For example, aerospace applications include actuators which may be used as motors to gently deploy spacecraft components such as booms, antennae and solar panels. Other aerospace applications include usage as constant force springs, flexures or connectors that need to accommodate very severe deformation but which spring back once the constraint is removed.

Commercial applications for hyperelastic SMA components are similarly of wide scope. They may be employed as a significantly improved replacement actuator or flexure over prior art SMA actuator applications. These applications include thermostatic valves, tools and instruments used in medicine, and other applications such as eyeglass frames and cellular telephone, antennae.

The invention contemplates devices and applications having hyperelastic SMA components, or including hyperelastic components, made fromed from single-crystal SMAs (or formed from seeds or alloys) formed by the alloying methods described herein.

Single-crystal SMAs formed by the methods described herein may be used in Aerospace and Military applications: As an actuator for active deployment of a host of devices including booms, antennae and solar panels.

Single-crystal SMAs formed by the methods described herein may be used as a flexure or constant force spring used for passive movement of cover doors or hinges.

Single-crystal SMAs formed by the methods described herein may be used as a connector where it is necessary to accommodate significant motion of adjacent parts. For example, heat pipes aboard spacecraft require such connectors to carry heating/cooling capability across a hinge to a deployable.

Single-crystal SMAs formed by the methods described herein may be used as a damper used to absorb or mitigate energy coming from nearby pyrotechnic release devices.

Single-crystal SMAs formed by the methods described herein may be used as a valve for a broad range of temperatures including cryogenic. Such valves have applications aboard missiles and satellites that carry sophisticated instruments such as sensors or cameras that need to be cryogenically cooled.

Single-crystal SMAs formed by the methods described herein may be used as an actuator in arming and safing ordnance.

Single-crystal SMAs formed by the methods described herein may be used as a substrate or support member for a surface or component which needs to accommodate large motion including applications on optical assemblies which require support and actuation (movement).

Single-crystal SMAs formed by the methods described herein may be used as a non-explosive separation device of smaller size than such bolts that are prior art.

Single-crystal SMAs formed by the methods described herein may be used as a flexible heat conductor or heat sink.

Single-crystal SMAs formed by the methods described herein may be used in medical devices. For example, they may be used for making catheter guidewires that are significantly more flexible than those currently made from stainless steel or polycrystal SMA. The CuAlNi alloy has no detectable cytotoxicity effect on the human body, and thus is compatible for use in a non-implantable function such as a catheter; in laproscopic instruments where it is necessary to make tools which can tolerate large distortions; and/or in implants such as stents where the material can be made bio compatible by coating with Au.

Single-crystal SMAs formed by the methods described herein may be used in automotive applications. For example, they may be used as an actuator for releasing door locks, moving mirrors and for driving fuel injector valves.

Single-crystal SMAs formed by the methods described herein may be used in computers or electronics applications, for example, in micro-connectors and switches where large displacement capability allows for more reliable assembly, and for the fabrication of smaller parts; in flexible cables' for print-heads and the like; and/or as constant-force probe tips for electronic testing of wafers and microcircuits.

Single-crystal SMAs formed by the methods described herein may be used in various commercial devices: as rings made for use as metallic connectors to secure braid in cabling applications, in switches, relays, circuit, breakers and electronic test equipment, etc.

Single-crystal SMAs formed by the methods described herein may be used in various consumer products. For example, they may be used in safety valves, eye glass frames and/or automobile and cellular telephone antennae.

Examples of Equipment With Hyperelastic Components

The present embodiment provides the use of hyperelastic SMA in applications such as equipment for sports and other activities. CuAlNi single crystal material stores an enormous amount of mechanical energy when it is deformed, and then releases the energy when the deforming force is removed. Unlike normally elastic materials, however the energy is stored and released at nearly constant force. These characteristics make this material desirable for use in equipment for use in a variety of sports and other activities.

Examples of applications benefiting from SMAs fabricated by the methods described herein include: bicycle wheel spokes equipped with a hyperelastic part to eliminate transmission to the hands of shocks due to small bumps in the road; running shoes and basketball shoes can contain a hyperelastic cushion that will reduce fatigue and enable the player to jump higher; skis that have a degree of hyperelastic behavior can reduce the shock of bumpy or irregular snow conditions and thereby improve control and provide a more comfortable, stable platform; as part of an of 'exoskeleton' that enables a human to jump higher or survive descending from a higher distance than normal.

The capacity for storage of mechanical energy is as much as 3 Joules gram of CuAlNi, and the majority of the energy is stored or released at a constant force resulting in constant acceleration. A parachutist, for example, wearing special boots containing a few hundred grams of CuAlNi would be protected from injury resulting from hitting the ground at a higher than usual speed.

Many of the above benefits will be most advantageous to amateurs, occasional athletes, and elderly people whose flexibility is impaired.

Snap-Through Hinge/Flexure Embodiments

The following embodiments provide devices such as hinges or flexures made of hyperelastic SMA that allow constrained relative motion without sliding or rotating components. These are used in space vehicles to provide lightweight structures such as booms that must be folded for launch into space. Similar flexures can also be used to replace prior art eyewear hinges.

These embodiments incorporate single-crystal hyperelastic materials into devices resembling tape-hinges resulting in superior load-carrying capability.

For spacecraft applications, the hinges/flexures must bend through an arc of 180 degrees to be useful in folding structures such as booms that are stored during launch in a minimal volume. Minimum size of the folded structure is achieved when the flexures bend through a minimal radius. In prior art implementations, flexures were made of thin steel curved tape. Steel in thin tape form does not provide optimum rigidity and strength for a functioning boom. This invention uses hyperelastic SMA in flexures capable of repeated recoverable large deformations to minimize size, maximize strength, and provide good vibration damping characteristics.

Among the design considerations for flexure design are that compression rigidity and resistance to buckling of the flexures should be consistent with that of the other components of the structure. These considerations set specifications for the flexure: length, thickness, width, curvature. This leads in turn to a design for a sliding die-mold for making the hyperelastic components.

In this embodiment, a tape hinge or flexure is formed by making a portion of a thin-walled cylinder and fixing it to rigid members or struts at the ends.

A principal feature of the invention is a "snap-through" action that resists bending because of its cylindrical symmetry which is very rigid for its mass, but when an applied force causes the flexure to buckle, it bends through a large angle with a smaller force. After buckling there is little restoring force because of its shape, that is, bending through a severe bending angle at a small radius of bend is possible because of the hyperelastic quality of the flexure. The flexure returns to its straight cylindrical rigid shape with a snap action because rigidity increases rapidly as the flexure assumes its cylindrical shell shape.

Performance of these devices, and their applicability, can be enhanced by increasing the recoverable strain, enlarging the stress tolerance, and extending the hyperelastic temperature range of the SMA materials. The method of deformation in tape-hinges results in non-uniform strain.

As the bending torque/moment is applied, the edge of the tape element is under tension, resulting in strain. After buckling occurs, this strain remains, and a bending moment is applied such that the inner surface is under compression and the outer surface is under tensile stress, with a neutral axis near the center of the cross-section.

Incorporating the SMA hyperelastic technology into a design in which all mechanical elements are in pure tension or pure compression, it becomes possible to build a structure that is very light, has a high packing factor for stowage, has a minimum of moving parts, and is very rigid for its weight. It is also possible to make it highly damped against vibrations. Hyperelastic alloys allow construction of structures that are strong against buckling while attaining a sharp radius of bend for compact folding.

It is desirable to make hinges that have no rotating or sliding parts. These devices can be used in spacecraft. One known form of hinge is a carpenter's tape hinge. Such a hinge may be made by bending an elongate element having a thickness much smaller than the width and having a curved cross-section. Such an element has a 'snap-action'. These hinges when made of steel or materials with ordinary elasticity are restricted to a small thickness in order to control the degree of strain within the elastic limit of the material. Limiting the strain to elastic deformation limits the rigidity that can be achieved with BeCu and steel tape-spring hinges. Thus such prior art hinges are limited to relatively light loads, and Structures incorporating such hinges are not as rigid as is desired.

A material having greatly increased elasticity will enable the fabrication of 'carpenter's tape' hinges with increased load-carrying capacity. One such material is hyperelastic single-crystal copper aluminum nickel in accordance with the present invention. This embodiment provides a significant improvement in the performance of tape hinges by exploiting the properties of hyperelastic shape memory phase change material.

A material having greatly increased elasticity will enable the fabrication of 'carpenter's tape' hinges with increased load-carrying capacity.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of alloying dissimilar materials comprising the steps of:
   (a) layering dissimilar materials in an alternating pattern to provide large areas of contact between the dissimilar materials;
   (b) heating the dissimilar materials;
   (c) melting the dissimilar materials;
   (d) mixing the melted dissimilar materials; and
   (e) cooling the mixed dissimilar materials to form an ingot, the method further comprising the step of reacting the dissimilar materials before melting.

2. The method of claim 1 wherein the dissimilar materials are materials selected from the group consisting of: aluminum, copper, nickel, manganese, zinc, titanium, nickel alloys, aluminum alloys, and copper alloys.

3. The method of claim 1 wherein the dissimilar materials include one or more sheets of aluminum and further wherein the one or more sheets of aluminum begins to melt prior to a melting of any other sheets of materials.

4. The method of claim 3 wherein the one or more sheets of aluminum are layered with one or more layers of copper and nickel.

5. The method of claim 1 wherein the dissimilar materials do not segregate while cooling.

6. The method of claim 1 wherein some of the dissimilar materials are nested within an adjacent material.

7. The method of claim 1 wherein the ingot has a uniform composition of 99%.

8. The method of claim 1 wherein the ingot has a weight of greater than 95% of a weight of the dissimilar materials.

9. The method of claim 1 wherein the dissimilar materials are sheets of material approximately 2 inches in length and width.

10. A method of alloying metals having a phase form dependent upon temperature comprising the steps of:
    (a) obtaining a plurality of dissimilar materials configured to provide large areas of contact between the plurality of dissimilar materials;
    (b) layering the dissimilar materials in an alternating pattern;
    (c) heating the dissimilar materials;
    (d) melting the dissimilar materials;
    (e) mixing the melted dissimilar materials; and
    (f) cooling the mixed dissimilar materials to form an ingot, the method further comprising the step of reacting the dissimilar materials before melting.

11. The method of claim 10 wherein the plurality of dissimilar materials are materials selected from the group consisting of: aluminum, copper, nickel, manganese, zinc, and titanium, copper alloys, aluminum alloys, and nickel alloys.

12. The method of claim 10 wherein the plurality of dissimilar materials includes one or more sheets of aluminum and further wherein one or more sheets of aluminum begins to melt prior to a melting of any other sheets of materials.

13. The method of claim 12 wherein one or more sheets of aluminum are layered with one or more layers of copper and nickel.

14. The method of claim 10 wherein some of the plurality of dissimilar materials are nested within an adjacent material.

15. The method of claim 10 wherein the ingot has a uniform composition of 99%.

16. The method of claim 10 wherein the ingot has a weight of greater than 95% of a weight of the plurality of the materials.

17. The method of claim 10 wherein the materials are approximately 2 inches in length and width.

18. A method of alloying dissimilar materials comprising the steps of:
    (a) layering dissimilar materials in an alternating pattern to provide large areas of contact between the dissimilar materials;
    (b) heating the dissimilar materials;
    (c) melting the dissimilar materials;
    (d) mixing the melted dissimilar materials; and
    (e) cooling the mixed dissimilar materials to form an ingot, wherein the dissimilar materials include one or more sheets of aluminum and further wherein the one or more sheets of aluminum begins to melt prior to a melting of any other sheets of materials.

19. The method of claim 18 wherein the one or more sheets of aluminum are layered with one or more layers of copper and nickel.

20. A method of alloying metals having a phase form dependent upon temperature comprising the steps of:
    (a) obtaining a plurality of dissimilar materials configured to provide large areas of contact between the plurality of dissimilar materials;
    (b) layering the dissimilar materials in an alternating pattern;
    (c) heating the dissimilar materials;
    (d) melting the dissimilar materials;
    (e) mixing the melted dissimilar materials; and
    (f) cooling the mixed dissimilar materials to form an ingot, wherein the plurality of dissimilar materials includes one or more sheets of aluminum and further wherein one or more sheets of aluminum begins to melt prior to a melting of any other sheets of materials.

21. The method of claim 20 wherein one or more sheets of aluminum are layered with one or more layers of copper and nickel.

* * * * *